United States Patent [19]

Moynihan

[11] Patent Number: 4,896,849

[45] Date of Patent: Jan. 30, 1990

[54] SAMPLE LEVITATION AND MELT IN MICROGRAVITY

[75] Inventor: Philip I. Moynihan, La Canada, Calif.

[73] Assignee: The United States of America as represented by the Administrator of the National Aeronautics and Space Administration, Washington, D.C.

[21] Appl. No.: 66,450

[22] Filed: Jun. 26, 1987

[51] Int. Cl.$^4$ ............................................... B64G 1/22
[52] U.S. Cl. ................... 244/158 R; 219/7.5; 373/10; 75/0.5 C; 75/20 F
[58] Field of Search ............... 244/158 R, 166, 164; 219/7.5, 10, 10.79, 20, 4, 31, 41, 121 L, 121 LR, 121 LE, 121 LF; 373/10, 15, 144; 75/0.5 C, 10.14, 20 F, 0.5 AA, 0.5 AB, 0.5 AC

[56] References Cited

U.S. PATENT DOCUMENTS

| | | | |
|---|---|---|---|
| 2,686,864 | 8/1954 | Wroughton et al. | 219/1 |
| 2,686,865 | 8/1954 | Kelly, Jr. | 219/1 |
| 2,927,187 | 3/1960 | Wendelken | 219/34 |
| 3,258,224 | 6/1966 | Sohn | 244/1 |
| 3,421,715 | 1/1969 | Cohlan | 244/166 |
| 3,534,926 | 10/1970 | Wuenscher | 244/1 |
| 3,999,950 | 12/1976 | Nagorsen | 23/273 SP |
| 4,408,740 | 10/1983 | Kleber | 244/158 R |
| 4,521,854 | 6/1985 | Rhim et al. | 364/400 |
| 4,578,552 | 3/1986 | Mortimer | 219/7.5 |
| 4,591,116 | 5/1986 | Guenther et al. | 244/168 |
| 4,677,642 | 6/1987 | Robinson et al. | 373/10 |

FOREIGN PATENT DOCUMENTS 2100540 8/1972 Fed. Rep. of Germany .

OTHER PUBLICATIONS

Peifer, "Journal of Metals," May 1965, p. 487.
Eyer, "Journal of Crystal Growth," 1979, p. 219.

Primary Examiner—Galen Barefoot
Attorney, Agent, or Firm—Thomas H. Jones; John R. Manning; Charles E. B. Glenn

[57] ABSTRACT

A system is described for maintaining a sample material in a molten state and away from the walls of a container in a microgravity environment, as in a space vehicle. A plurality of sources of electromagnetic radiation, such as an infrared wavelength, are spaced about the object, with the total net electromagnetic radiation applied to the object being sufficient to maintain it in a molten state, and with the vector sum of the applied radiation being in a direction to maintain the sample close to a predetermined location away from the walls of a container surrounding the sample. For a processing system in a space vehicle that orbits the Earth, the net radiation vector is opposite the velocity of the orbiting vehicle.

7 Claims, 2 Drawing Sheets

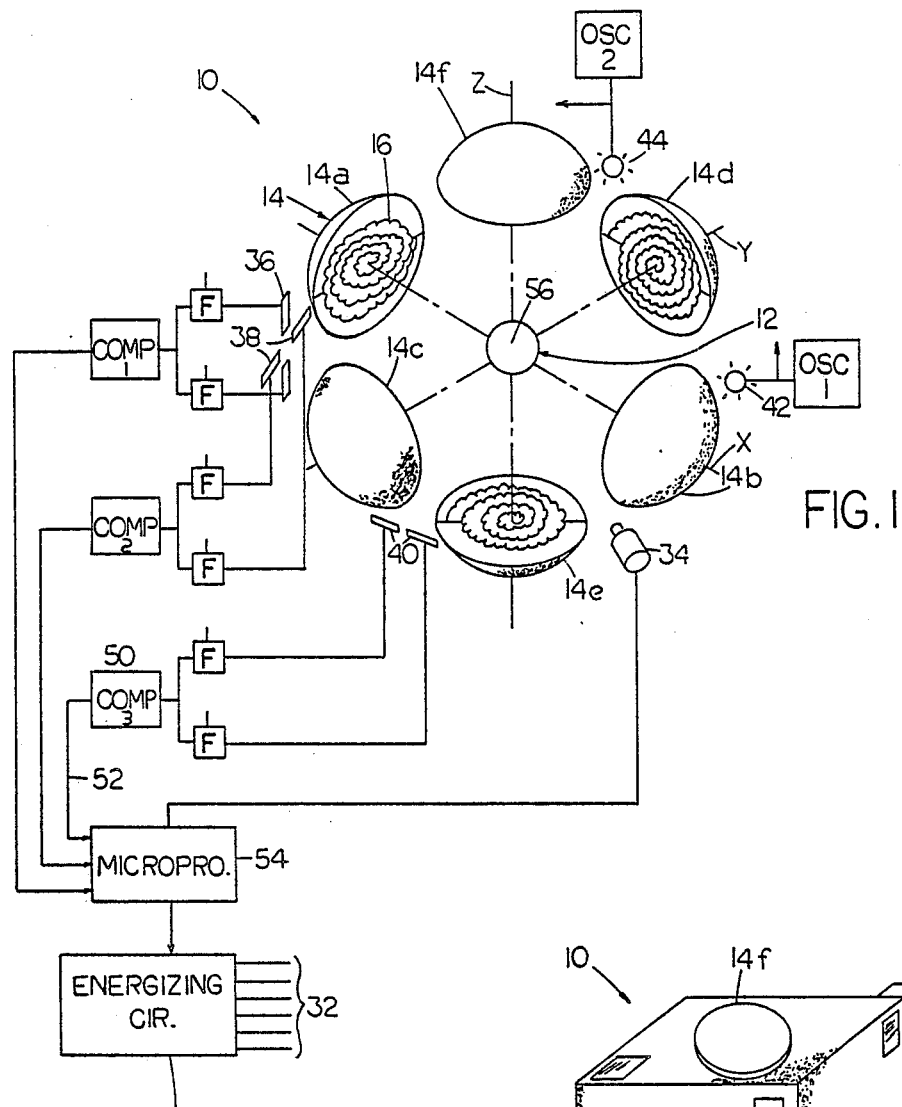
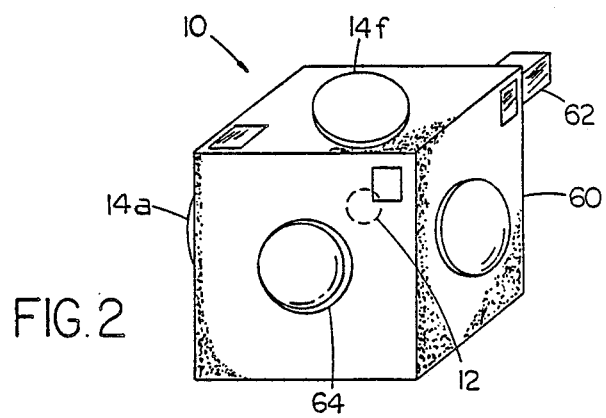
FIG. 1
FIG. 2

SAMPLE LEVITATION AND MELT IN MICROGRAVITY

ORIGIN OF THE INVENTION:

The invention described herein was made in the performance of work under a NASA contract, and is subject to the provisions of Public Law 96-517 (35 USC 202) in which the Contractor has elected not to retain title.

BACKGROUND OF THE INVENTION:

Investigations of high melting temperature materials in an ultra-high purity state is best conducted by maintaining a material sample in a molten state while it is isolated from potential sources of contamination. A sample can be levitated, or held in place, in a microgravity environment such as exists in an orbiting space vehicle, by several techniques. One levitation technique involves the application of an acoustic standing wave within a container, but this requires the sample to be immersed in a gaseous medium which could contaminate it, and also results in high-frequency disturbances to the sample from the high-frequency acoustic energy. In addition, it is very difficult to heat the levitated sample. Another technique involves the directing of electron or ion beams at the sample, but this can result in the injection of the electrons or ions into the sample which can affect its characteristics. A system which could levitate a molten object to avoid its contact with the walls of a solid container, which minimized or avoided contact of the molten object with even subatomic particles that have masses, while minimizing disturbances of the levitated object, would be of considerable value. Any such system which could maintain the object at an elevated temperature while levitating it, using relatively low-cost devices, would be of considerable value.

SUMMARY OF THE INVENTION

In accordance with one embodiment of the present invention, a method and apparatus are provided for levitating an object in a microgravity environment while maintaining it at an elevated temperature, and while minimizing contamination of the object. At least one source of electromagnetic radiation is located on a facility, such as a spacecraft, in a microgravity environment, and the source is positioned to direct electromagnetic radiation at the object. The electromagnetic radiation (generally infrared radiation of about $10^{-6}$ meters wavelength) produces a mechanical pressure, and the vector sum of the radiation pressure opposes excessive drift of the object, to counter movement of the object that would otherwise occur in the microgravity environment. The net sum of electromagnetic radiation directed at the object is preferably sufficient to maintain the object in a molten state.

Where the space vehicle on which the object is located is in Earth orbit, the vector sum of electromagnetic radiation is opposite the velocity of the space vehicle. Thus, drift of the object due to microdeceleration of the space vehicle caused by air resistance is avoided. In one system, a group of electromagnetic radiation sources are positioned along three mutually perpendicular axes, and the relative power levels at which the sources are energized is varied to control the net vector of radiation pressure. In another system, at least one of the radiation sources is movable.

The novel features of the invention are set forth with particularity in the appended claims. The invention will be best understood from the following description when read in conjunction with the accompanying drawings.

BRIEF DESCRIPTION OF THE DRAWINGS:

FIG. 1 is a perspective and block diagram view showing the basic elements of a levitation system constructed in accordance with one embodiment of the present invention.

FIG. 2 is a perspective view of the system of FIG. 1 showing a container surrounding the levitated object.

DESCRIPTION OF THE PREFERRED EMBODIMENTS:

FIG. 1 illustrates a system 10 which can be mounted on a space vehicle where there is a microgravity environment, for heating an object 12 and for levitating the object to hold it approximately in a desired position relative to the spacecraft. The system includes several sources 14 of electromagnetic radiation, which are spaced about the object to direct the radiation at the object from different directions. The system of FIG. 1 includes six sources 14a-14e, with pairs of such sources located along each of three mutually perpendicular axes X, Y, and Z. Each of the sources 14 includes a coiled filament 16 which can carry current to become heated and emit electromagnetic radiation, primarily in the infrared spectrum. The radiation emissions serve to heat the object 12 to a molten state and to maintain it in that state for an extended period of time. The radiation emitted by the sources also apply a radiation pressure to the object which can be sufficient to hold the object in position relative to the sources and to a spacecraft on which the sources are mounted.

There are many applications in material science where it is desirable to heat an object to its molten temperature and maintain it thereat without the object coming in contact with any material (sometimes even gases). Such applications are not only to identify new materials and processing techniques, as to obtain precursors for optical fiber production, but also to study fundamental physical and chemical phenomena. For example, it is desirable to investigate homogenous and heterogeneous nucleation and crystallization of glasses. On Earth, glasses tend to crystallize heterogeneously, with initiation on the container walls. Also, impurities introduced from the container may introduce crystal nucleation rates even for glasses nucleating in the bulk, all of which renders study very difficult on Earth. A system for heating the glasses while levitating them in a vacuum can enhance such studies.

Figure 3:
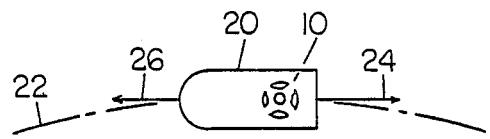
FIG. 3 is a representational view of a spacecraft in orbit around the Earth, and on which the system of FIG. 1 is mounted.

When the processing system 10 lies on a space vehicle such as shown at 20 in FIG. 3, which is in an orbit 22 around the Earth 24, the system is in a microgravity environment. The system is subjected to disturbances, such as when an astronaut moves on the vehicle, but such disturbances generally cause only a temporary movement of the object, with the return of the object to its initial position at the end of the disturbance. However, the space vehicle is subject to a constant deceleration in a direction 24 opposite to its orbital velocity.

Such deceleration is due to drag of the space vehicle from rarified air. For example, a space vehicle in an orbit 100 miles above the Earth experiences deceleration resulting in a microgravity of about $10^{-6}G$ to $10^{-5}G$ (where 1G is gravity on the Earth's surface). A small but non-negligible force must be applied to the levitated object to prevent it from slowly accelerating in the direction 26 of the microgravity.

A major question in the use of pressure generated by electromagnetic radiation is whether sufficient pressure can be applied to actually levitate an object under typical conditions that would be encountered. The following sets forth formulas for calculating the force of electromagnetic radiation produced on an object by a radiation source, and is followed by a specific example. The force F (in dynes) on an object produced by electromagnetic radiation thereon is given by:

$$F = pA_2 \text{ dynes} \qquad \text{Eq. 1}$$

Where $A_2$ is the area in cm$^2$ of the object exposed to the radiation and p is the flux or radiation pressure per unit area in dynes per cm$^2$. The radiation pressure p is given by:

$$p = \frac{4}{3c} \frac{q_{1-2}}{A_1} \times 10^7 \times A_2 \text{ dynes/cm}^2 \qquad \text{Eq. 2}$$

Where $A_1$ is the area in cm$^2$ of the source of electromagnetic radiation facing the object, c is the speed of light which equals $2.998 \times 10^{10}$ cm/sec, and $q_{1-2}$ is the radiation exchange in watts between the two objects. The radiation exchange $q_{1-2}$ between two "gray" objects can be expressed as:

$$q_{1-2} = \frac{1}{\frac{1}{A_2}\left(\frac{1}{e_1} - 1\right) + \frac{1}{A_2}\left(\frac{1}{e_2} - 1\right) + \frac{1}{A_1 \overline{F}_{1-2}}} S(T_1^4 - T_2^4) \qquad \text{Eq. 3}$$

Where $e_1$ and $e_2$ are the emissivities of the source and the object, $\overline{F}_{1-2}$ is the view factor representing how much of the angle of view of the source is taken up by the object and vice versa, s is the Stefan-Boltzman constant which equals $5.667 \times 10^{-12}$ w/cm$^2$K$^4$, and $T_1$ and $T_2$ represent the temperatures in degrees Kelvin of the source and object, respectively.

In one example, a glass material sample of 1 cm diameter ($A_2 = 0.785$ cm$^2$) is located 0.635 cm (one-quarter inch) from the heat source. The sample has a density d of 2.72 gm/cm$^2$, and therefore has a specific density $d_s$ of 2,670 dynes/cm$^2$. The weight W of the sample in a $10^{-5}$g field is:

$$W = d_s V \frac{g}{g_0} = 2,670 \times \frac{\pi}{6} D^3 \times 10^{-5} = 0.014 \text{ dynes} \qquad \text{Eq. 4}$$

Thus, a radiation force of at least 0.014 dynes must be exerted opposite to the microgravity field to prevent sample movement relative to the spacecraft.

Continuing with the above example, it may be assumed that a tungsten filament heat source is used with the tungsten coiled to 1 cm diameter ($A_1 = 0.785$ cm). The tungsten filament is heated to a temperature $T = 6,000°$ F. $= 3588°$ K. The emissivity of the sample is assumed to be 0.30, while the emissivity of the heated tungsten filament is assumed to be 0.35. The view factor of the sample and heat source of the above dimensions and separation is given by the following ($r_1$, $r_2$, and L are respectively the radii of the heat source and of the sample, and their separation):

$$F_{1-2} = \frac{1}{2r_1^2}[L^2 + r_1^2 + r_2^2 - \qquad \text{Eq. 5}$$

$$\sqrt{(L^2 + r_1^2 + r_2^2) - 4r_1^2 r_2^2}] = \frac{1}{2(.5)^2}[0.635^2 + .5^2 + .5^2 -$$

$$\sqrt{(.635 + .5^2 + .5^2)^2 - 4(.5)^2 - 4(.5)^2(.5)^2}] = 0.302$$

Using the above numbers in equation 3, the initial heat exchange of the source and sample (the sample is assumed to be at 293° K.) equals:

$$q_{1-2} = \frac{1}{\frac{1}{.785}\left(\frac{1}{.35} - 1\right) + \frac{1}{.785}\left(\frac{1}{.3} - 1\right) + \frac{1}{.785(.302)}} \qquad \text{Eq. 6}$$

$$(5.667 \times 10^{-12})(3,588^4 - 293^4) = 98.7w$$

Using the above numbers in equations 1 and 2, the force imparted on the sample by the radiation pressure is:

$$F = pA_2 = \qquad \text{Eq. 7}$$

$$\frac{4}{3(3 \times 10^{10})} \frac{98.7}{.785} \times 10^7 \times .785 = 0.044 \text{ dynes}$$

Thus, when the sample is at room temperature, the radiation pressure of 0.044 dynes is greater than the "weight" of 0.014 dynes of the sample in a $10^{-5}$g microgravity environment. It may be noted that the above example assumes the radiation source is omnidirectional, rather than the radiation being concentrated at the sample which produces greater heating and a greater radiation pressure. When the sample reaches a desired equilibrium temperature such as 2,000° C. (2,273° K.) the heat exchange between the source and sample becomes:

$$q_{1-2} = 82.80 \text{ watts}$$

Which results in a radiation force of:

$$F = 0.037 \text{ dynes}$$

Thus, the force on the sample at equilibrium temperature of 0.037 dynes, exceeds the 0.014 dyne weight of the sample in this example. The radiation pressure is dominated by the source temperature, and does not vary significantly as the sample temperature increases from ambient to 2,000° C. In the above example, an estimate of the time required for the sample to reach 2,000° C. is about 15 minutes. Cold sources, such as cooled plates at the positions of sources 14b–14f in FIG. 1, can be used to allow the sample to cool while radiation from a hot source 14a maintains sample position. Alternately, the intensities of the radiation sources can be altered. The above example serves to demonstrate that a feasible radiation source for heating a feasible sample to be processed, can apply sufficient force through electromagnetic radiation pressure to hold the sample against microgravity forces that can be encountered, and especially the microgravity resulting from drag on a space vehicle orbiting the Earth.

Referring again to FIG. 1, the system includes an energizing circuit 30 having six outputs 32, each connected to a different one of the sources 14a–14f to energize it (a ground return is not shown). The average energization of the six sources is determined by the difference between the actual sample temperature as determined by a sensor 34 and the desired sample temperature. The position of the sample is sensed by three pairs of light sensors 36–40. Each pair of sensors senses light from one of two light generators 42, 44 to sense movement of the object in any one of three dimensions. The outputs of each pair of sensors such as 40a, 40b is passed through a separate filter 46 to a comparator 50 which generates an output on line 52 proportional to the difference in outputs of the two sensors, which indicates object movement. The outputs of the three comparators are delivered to a microprocessor 54 which controls the relative energizations of the six radiation sources by circuit 30. If the object moves away from a desired initial position 56, and that movement persists long enough (e.g., 5 seconds) to indicate a continuous drift rather than a temporary disturbance, the microprocessor controls the energizing circuit 30 to increase current to those sources towards which the object is moving and to decrease the current to the sources away from which the object is moving.

FIG. 2 illustrates additional details of the system 10, showing a container 60 surrounding the object 12, and with a conduit 62 leading from the inside of the container to the outside of the spacecraft, where there is a very low-pressure vacuum, which is much less than one-thousandth atmospheric pressure. Where desired, it is possible to maintain an inert gas within the chamber. A quartz or other acceptable window 64 lies between the filament of each source of electromagnetic radiation and the object, to avoid the passage of most particles (except photons) Where a filament is used which does not outgas significantly, such a window barrier can be eliminated.

It may be noted that where a known microgravity force exists in a known direction, such as along the orbital velocity of a space vehicle, the source or sources lying in the direction to which the object is urged by the microgravity can be constantly energized at a sufficiently higher level than opposite sensors to counteract the sustained microgravity. Then, an occasional change in energization pattern occurs primarily when unpredicted microgravity sources are present.

Figure 4:
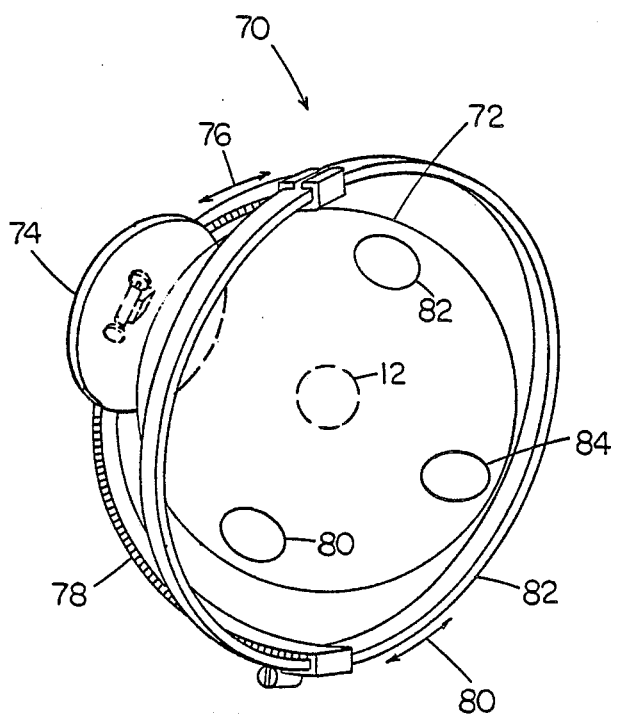
FIG. 4 is a partial perspective view of a levitation system constructed in accordance with another embodiment of the invention.

FIG. 4 illustrates another system 70 for heating and levitating an object 12 within a container 72, which is especially useful where there is a constant microgravity present such as in an orbiting spacecraft. A main electromagnetic source 74 is movable in directions 76 on a first guide 78, while the first guide is movable in directions 80' on a second guide 82'. 5 This allows the source 74 to be moved relative to the spacecraft about the levitated object. The main source 74 is located on a side of the object towards which microgravity tends to move the object. If the object wanders, the position of the source 74 can be altered, as can its level of radiation output. Additional secondary sources 80–84 serve to heat the object more uniformly and enable the application of radiation pressure opposite to the usual direction.

Thus, the invention provides a method and apparatus for heating an object and levitating it. The system includes sources of electromagnetic radiation, which are devoid of particle radiation, for heating the object and for applying radiation pressure that levitates the object, while avoiding contamination of the object. The above analysis shows that in a practical system the radiation pressure is sufficient to levitate an object under microgravity forces that are likely to be encountered in a space vehicle during sample processing.

Although particular embodiments of the invention have been described and illustrated herein, it is recognized that modifications and variations may readily occur to those skilled in the art, and consequently, it is intended that the claims be interpreted to cover such modifications and equivalents.

What is claimed is:

1. Apparatus useful in a microgravity outer space environment for levitating an object relative to a space vehicle, and establishing the object at an elevated temperature comprising:

a plurality of electromagnetic radiation sources on said space vehicle, said source spaced about said object and oriented to emit electromagnetic radiation toward said object, each of said sources being adjustable to vary the amount of electromagnetic radiation output it emits towards said object;

means for controlling the electromagnetic radiation output of each source in a pattern which produces net electromagnetic radiation pressure from said sources in a predetermined direction and with a force sufficient to maintain said object at a substantially constant position relative to said space vehicle while applying a controlled total amount of heat to said object to substantially melt it, with at least one of said sources emitting electromagnetic radiation in a direction not substantially along said predetermined direction.

2. The apparatus described in claim 1 wherein:

said space vehicle is in orbit around the earth, and a majority of said radiation is directed opposite to the orbital velocity of said space vehicle.

3. The apparatus described in claim 1 including;

a container filled with a vacuum less than one-thousandth that of atmospheric pressure and surrounding said object, and said means for controlling applies sufficient electromagnetic radiation to melt said object and maintain it at a molten temperature while avoiding the application of particle radiation to said object.

4. A method for establishing an object at approximately a predetermined location within a container, said location being away from the walls of the container while the container lies in a microgravity environment, and for maintaining the object in a molten state and while also avoiding contamination of said object in its molten state, comprising:

establishing a plurality of electromagnetic radiation emitters at spaced locations about said object and oriented to emit said radiation toward said object, and energizing said emitters to a temperature sufficiently greater than the melt temperature of said object to maintain said object in a molten state;

sensing the position of said object relative to said container, and varying the relative temperatures of said emitters so an emitter on a side of said object towards which said object drifts away from said predetermined location, is established at a higher temperature than an emitter on an opposite side of said object, including establishing one of said emitters which lies on a side of said object away from the direction of object drift at a higher temperature than the melt temperature of the object while still energizing an emitter lying on a side of said object which is at least partially toward the direction of object drift.

5. The method described in claim 4 wherein:
said container is designed to lie in a spacecraft in orbit around the earth, and said emitters are energized to direct electromagnetic radiation of greater radiation pressure opposite to the orbital velocity of said spacecraft than in the direction of the spacecraft orbital velocity.

6. Apparatus useful in a microgravity outer space environment for levitating an object relative to a space vehicle, and establishing the object at an elevated temperature comprising:

a plurality of electromagnetic radiation sources on said space vehicle, said sources spaced about said object and oriented to emit electromagnetic radiation toward said object, each of said sources being adjustable to vary the amount of electromagnetic radiation output it emits towards aid object;

means for controlling the electromagnetic radiation output of each source in a pattern which produces net electromagnetic radiation pressure from said sources in a predetermined direction and with a force sufficient to maintain said object at a substantially constant position relative to said space vehicle while applying a controlled total amount of heat to said object, with at least one of said sources emitting electromagnetic radiation in a direction not substantially along said predetermined direction;

each of said radiation sources including a filament, means for passing current through the filament, and a light-transparent window of solid material between said filament and said object for passing light from said filament to said object while blocking the passage of most atomic and subatomic particles therebetween.

7. Apparatus useful in a microgravity outer space environment for levitating an object relative to a space vehicle, which moves in orbit around the earth and establishing the object at an elevated temperature comprising:

at least one electromagnetic radiation source located on said vehicle and positioned to direct electromagnetic radiation at said object with most of said radiation directed at said object opposite to the velocity of said vehicle in tis orbit, said at least one source including a source which is movable around said object to vary the direction from which it directs radiation at the object.

* * * * *